United States Patent
Lee et al.

(10) Patent No.: US 9,577,575 B2
(45) Date of Patent: Feb. 21, 2017

(54) INJECTION LOCKED FREQUENCY DIVIDER CAPABLE OF ADJUSTING OSCILLATION FREQUENCY

(71) Applicant: Research & Business Foundation Sungkyunkwan University, Suwon-si (KR)

(72) Inventors: Kang Yoon Lee, Seoul (KR); Sang Yun Kim, Suwon-si (KR); Young Jun Park, Daegu-si (KR); Dong Soo Lee, Dangjin-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 14/966,294

(22) Filed: Dec. 11, 2015

(65) Prior Publication Data

US 2016/0248377 A1 Aug. 25, 2016

(30) Foreign Application Priority Data

Dec. 11, 2014 (KR) ........................ 10-2014-0178235

(51) Int. Cl.
- *H03K 21/00* (2006.01)
- *H03B 19/14* (2006.01)
- *H03K 3/03* (2006.01)

(52) U.S. Cl.
CPC ............ *H03B 19/14* (2013.01); *H03K 3/0315* (2013.01); *H03B 2200/007* (2013.01); *H03B 2200/0074* (2013.01)

(58) Field of Classification Search
CPC .............. H03B 19/14; H03B 2200/007; H03B 2200/0074; H03K 3/0315
USPC .......................................................... 327/115
See application file for complete search history.

(56) References Cited

U.S. PATENT DOCUMENTS

| | | | | |
|---|---|---|---|---|
| 2005/0219003 | A1* | 10/2005 | Urakawa ................. | H03L 7/099 331/117 R |
| 2009/0102565 | A1* | 4/2009 | Jang ........................ | H03B 19/14 331/40 |
| 2014/0035684 | A1* | 2/2014 | Na ........................... | H03L 5/00 331/15 |

(Continued)

*Primary Examiner* — Ryan Jager
(74) *Attorney, Agent, or Firm* — NSIP Law (57) ABSTRACT

An injection locked frequency divider is disclosed. The injection-locked frequency divider includes a sub-harmonic injection-locked oscillator, a reference clock divider, a counter, and a variable load resistor control unit. The sub-harmonic injection-locked oscillator has variable load resistors that are adjusted in response to a resistance adjustment signal, and, when oscillation frequency determined based on the magnitudes of the variable load resistors is a sub-harmonic of an injection signal, outputs signals having the oscillation frequency as divided output signals. The reference clock divider generates a count-enable signal from a reference clock signal according to a reference division ratio. The counter generates divided output count signals based on the divided output signals in response to the count-enable signal. The variable load resistor control unit compares target count values, determined based on the target frequencies of the divided output signals, with the divided output count signals, and outputs the resistance adjustment signal.

17 Claims, 6 Drawing Sheets

(56) References Cited

U.S. PATENT DOCUMENTS

2015/0316894 A1* 11/2015 Taghezout ............. G04C 10/00
 368/187
2016/0234007 A1* 8/2016 Lee ....................... H04L 7/0012

* cited by examiner

INJECTION LOCKED FREQUENCY DIVIDER CAPABLE OF ADJUSTING OSCILLATION FREQUENCY

CROSS-REFERENCE TO RELATED APPLICATION

This application claims the benefit under 35 USC 119(a) of Korean Patent Application No. 10-2014-0178235 filed on Dec. 11, 2014 in the Korean Intellectual Property Office, the entire disclosure of which is incorporated herein by reference for all purposes.

BACKGROUND

1. Technical Field

The present invention relates generally to an injection-locked frequency divider, and more particularly to an injection-locked frequency divider that is capable of adjusting oscillation frequency for itself.

2. Description of the Related Art

Individual countries are enforcing spectrum policies that strictly stipulate usages and licenses for respective frequency bands. In most non-European countries, the super-high frequency band, such as the 60 GHz band, is a band that can be used without permission or a license. Recently, broadband high-speed wireless communication systems have been researched to provide personal area wireless communication service that does not require such permission.

In order to implement an analog communication chip operating in a super-high frequency band, a phase-locked loop (PLL) or frequency synthesizer that operates at a super-high frequency should be ensured first.

In particular, a PLL, a frequency generator or the like has a phase detector in a loop in order to perform accurate frequency and phase locking. The phase detector may operate properly only if the frequency of an oscillation signal is reduced to a frequency that is suitable for the operating range of a common phase detector. Accordingly, there is required a frequency divider that receives the frequency of an oscillation signal in a super-high frequency band and that operates stably in a broad operating range, i.e., a broad oscillation range, in which the frequency can be reduced to a frequency that is suitable for the operating range of the phase detector.

Although various types of frequency dividers have been proposed, an injection-locked frequency divider (ILFD) has the best characteristics in terms of the dynamic range of operation frequencies because the ILFD can operate in a tens of GHz band. In particular, a ring oscillator-based ILFD has a significantly smaller circuit area and a larger successfully synchronizable range than an LC oscillation circuit-based ILFD.

An injection locking phenomenon is a phenomenon that is generated by a nonlinear oscillation circuit when a signal having a different frequency is injected into a nonlinear oscillation circuit having its own oscillation frequency from the outside. The oscillation circuit into which the different frequency has been injected basically oscillates at an oscillation frequency, but a beat corresponding to the difference between the injection frequency and the oscillation frequency appears along with the waveform of the oscillation frequency. Meanwhile, when the difference between the oscillation frequency and the injection frequency is reduced to a value smaller than a specific threshold value, the beat disappears and a phenomenon in which the oscillation circuit oscillates at the injection frequency instead of its own oscillation frequency occurs. This phenomenon is called injection synchronization.

An injection locking phenomenon also occurs when oscillation frequency is a harmonic (that is, n times when n is a positive integer) or sub-harmonic (i.e., 1/n times) of the injection frequency. Using an injection locking phenomenon that occurs at a sub-harmonic, an injection-locked frequency divider that frequency-divides an injection frequency by 1/n can be constructed.

Since the injection-locked frequency divider is intended to operate in the state of being locked to the sub-harmonic frequency of the injection frequency, the desired sub-harmonic frequency for the injection frequency and the oscillation frequency inside the oscillation circuit must be so close to each other as to generate the injection locking phenomenon. Accordingly, the stability of the oscillation frequency of the oscillation circuit is important.

SUMMARY

At least one embodiment of the present invention is directed to the provision of an injection-locked frequency divider capable of adjusting oscillation frequency.

At least one embodiment of the present invention is directed to the provision of an injection-locked frequency divider capable of adjusting oscillation frequency, which has both a small area and low power consumption.

According to an aspect of the present invention, there is provided an injection-locked frequency divider, including: a sub-harmonic injection-locked oscillator configured to have variable load resistors that are adjusted in response to a resistance adjustment signal, and to, when oscillation frequency determined based on magnitudes of the variable load resistors is a sub-harmonic of an injection signal, output signals having the oscillation frequency as the divided output signals of the injection signal; a reference clock divider configured to generate a count-enable signal from a reference clock signal according to a reference division ratio; a counter configured to generate divided output count signals based on the divided output signals in response to the count-enable signal; and a variable load resistor control unit configured to compare target count values, determined based on the target frequencies of the divided output signals, with the divided output count signals, and to output the resistance adjustment signal.

The reference clock divider may be operative to generate the count-enable signal by frequency-dividing the reference clock signal according to the reference division ratio.

The variable load resistor control unit may include: a comparison unit configured to compare the target count values, determined based on the target frequencies of the divided output signals, with the values of the divided output count signals, and to output one of an up signal and a down signal; and a resistance adjustment signal determination unit configured to output an updated resistance adjustment signal obtained by increasing or decreasing the binary value of an immediately previous resistance adjustment signal in response to the up or down signal.

The reference clock divider may generate a first clock signal after an enabled section of the count-enable signal has been terminated and provide the first clock signal to the comparison unit, and may generate a second clock signal obtained by delaying the first clock signal and provide the second clock signal to the resistance adjustment signal determination unit.

The resistance adjustment signal determination unit may be operative to update the bit value of the resistance adjustment signal according to a sequential search technique whenever the up or down signal is input, and to output an adjustment completion signal to the outside when all the bit values of the resistance adjustment signal have been determined.

The resistance adjustment signal determination unit may be operative to update the bit value of the resistance adjustment signal according to a binary search technique whenever the up or down signal is input, and to output an adjustment completion signal to the outside when all the bit values of the resistance adjustment signal have been determined.

The variable load resistors may be configured to vary total load resistance in such a way that a plurality of load resistors, whose resistance values have been set according to a binary weighted method, is connected in parallel and is then connected or disconnected based on respective bits of the resistance adjustment signal.

The injection-locked frequency divider may further include a target count storage unit configured to previously store the target count values determined based on the target frequencies of the divided output signals, and to output the target count signal to the variable load resistor control unit in accordance with a target count value selected in accordance with the reference division ratio.

The sub-harmonic injection-locked oscillator may be a ring-type injection locked oscillator.

The sub-harmonic injection-locked oscillator may be a ring-type injection-locked oscillator.

The sub-harmonic injection-locked oscillator may be a ring-type differential injection-locked oscillator.

According to another aspect of the present invention, there is provided a method of adjusting the oscillation frequency of an injection-locked frequency divider including a sub-harmonic injection-locked oscillator configured to output signals having an oscillation frequency as the divided output signals of an injection signal when the oscillation frequency is a sub-harmonic of the injection signal, the method including: initializing, by the injection-locked frequency divider, a resistance adjustment signal adapted to adjust the magnitudes of variable load resistors that determine oscillation frequency generated by the sub-harmonic injection-locked oscillator; frequency-dividing, by the sub-harmonic injection-locked oscillator, the injection signal, and outputting, by the sub-harmonic injection-locked oscillator, divided output signals; generating, by the injection-locked frequency divider, a count-enable signal from a reference clock signal according to a reference division ratio; generating, by the injection-locked frequency divider, divided output count signals by counting the pulses of the divided output signals in response to the count-enable signal; comparing, by the injection-locked frequency divider, target count signals, determined based on the target frequencies of the divided output signals, with the divided output count signals, and outputting, by the injection-locked frequency divider, the resistance adjustment signal; and adjusting, by the sub-harmonic injection-locked oscillator, the variable load resistors in response to the resistance adjustment signal.

Generating the count-enable signal may include generating the count-enable signal by frequency-dividing the reference clock signal according to the reference division ratio.

Outputting the resistance adjustment signal may include: comparing the target count values, determined based on the target frequencies of the divided output signals, with the values of the divided output count signals, and then outputting one of an up signal and a down signal; and outputting an updated resistance adjustment signal obtained by increasing or decreasing the binary value of an immediately previous resistance adjustment signal in response to the up or down signal.

Outputting the resistance adjustment signal may include updating the bit value of the resistance adjustment signal according to a sequential search technique whenever the up or down signal is input, and outputting an adjustment completion signal to the outside when all the bit values of the resistance adjustment signal have been determined.

Outputting the resistance adjustment signal may include updating the bit value of the resistance adjustment signal according to a binary search technique whenever the up or down signal is input, and outputting an adjustment completion signal to the outside when all the bit values of the resistance adjustment signal have been determined.

The variable load resistors may be configured to vary total load resistance in such a way that a plurality of load resistors, whose resistance values have been set according to a binary weighted method, is connected in parallel and is then connected or disconnected based on respective bits of the resistance adjustment signal.

The method may further include outputting the target count signal, corresponding to a target count value selected from the target count values determined based on target frequencies of the divided output signals, according to the reference division ratio.

The sub-harmonic injection-locked oscillator may be a ring-type injection-locked oscillator.

The sub-harmonic injection-locked oscillator may be a ring-type differential injection-locked oscillator.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

As to embodiments of the present invention disclosed herein, specific structural and functional descriptions are given merely for the purpose of illustrating the embodiments of the present invention. Embodiments of the present invention may be practiced in various forms, and the present invention should not be construed as being limited to the embodiments disclosed herein.

Embodiments of the present invention will be described in detail below with reference to the accompanying drawings. The same reference numerals are assigned to the same components throughout the accompanying diagrams, and redundant descriptions of the same components are omitted herein.

Figure 1:
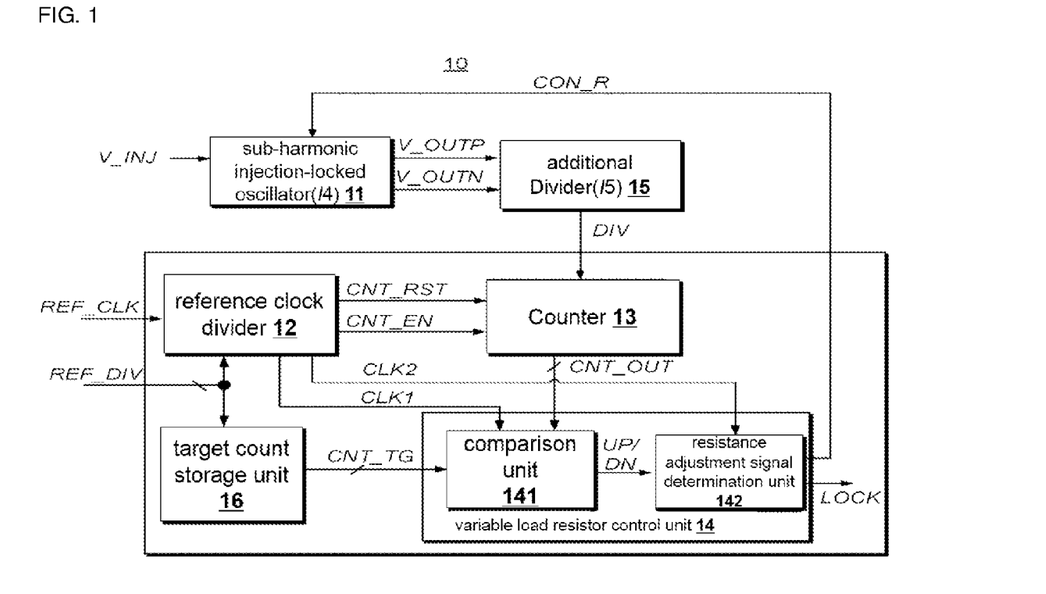
FIG. 1 is a block diagram illustrating an injection-locked frequency divider capable of adjusting oscillation frequency according to an embodiment of the present invention.

FIG. 1 is a block diagram illustrating an injection-locked frequency divider 10 capable of adjusting oscillation frequency according to an embodiment of the present invention.

Referring to FIG. 1, the injection-locked frequency divider 10 according to the present embodiment may include a sub-harmonic injection-locked oscillator 11, a reference clock divider 12, a counter 13, and a variable load resistor control unit 14.

In an embodiment, the injection-locked frequency divider 10 may further include an additional divider 15 configured to additionally frequency-divide the divided output signals V_OUTP and V_OUTN of the sub-harmonic injection-locked oscillator 11 and to provide the results of the division to the counter 13.

Furthermore, in an embodiment, the injection-locked frequency divider 10 may further include a target count storage unit 16 configured to previously store target count values determined based on the target frequencies of the divided output signals.

The sub-harmonic injection-locked oscillator 11 may have variable load resistors configured to be adjusted in response to a resistance adjustment signal CON_R, and may output divided output signals V_OUTP and V_OUTN obtained by frequency-dividing an injection signal V_INJ. The magnitudes of the variable load resistors are an important factor that may determine the own oscillation frequency of the sub-harmonic injection-locked oscillator 11.

Figure 2:
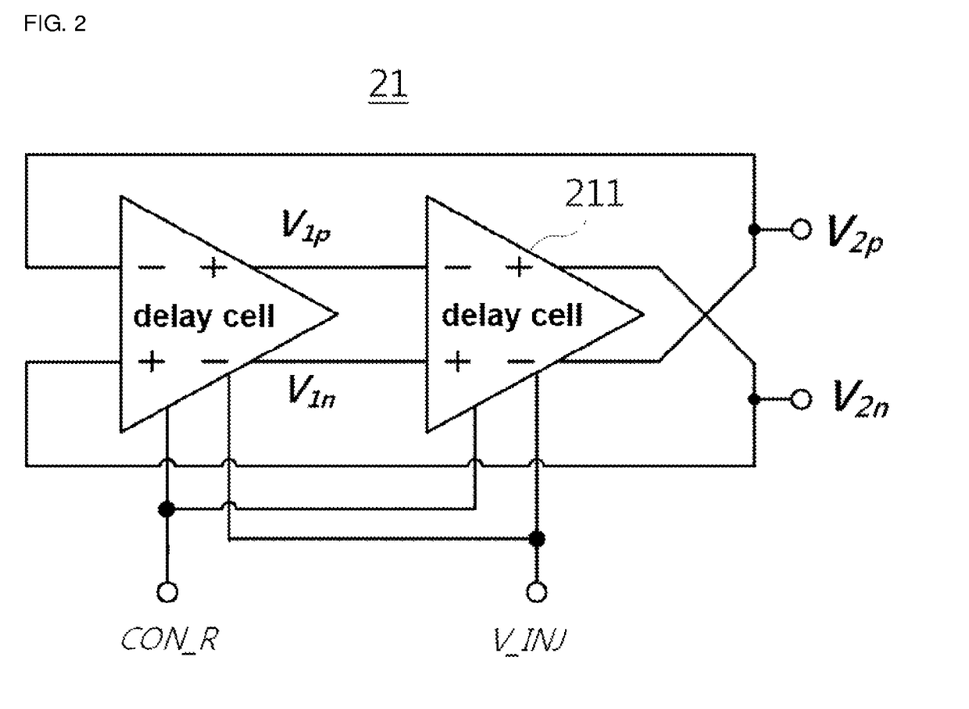
FIG. 2 is a circuit diagram illustrating a ring-type differential injection-locked oscillator that may be used in an injection-locked frequency divider capable of adjusting oscillation frequency according to an embodiment of the present invention.

In an embodiment, the sub-harmonic injection-locked oscillator may be a ring-type oscillator, more specifically a ring-type differential oscillator, such as that of FIG. 2.

Figure 3:
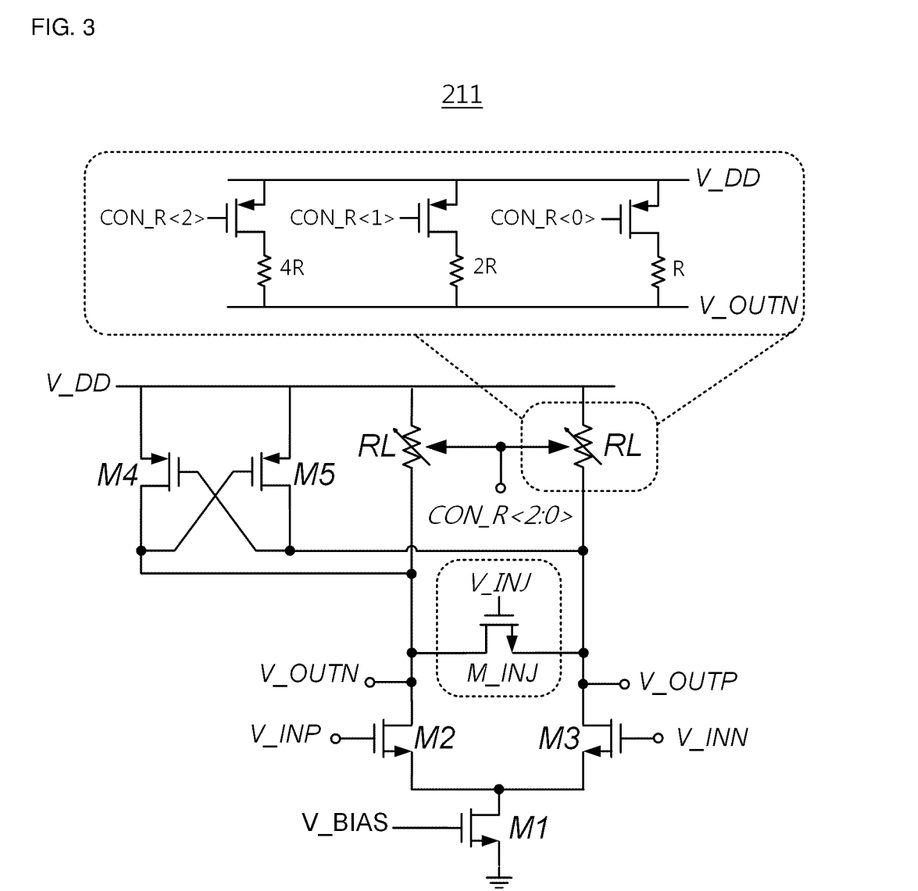
FIG. 3 is a circuit diagram illustrating a delay cell of a ring-type differential injection-locked oscillator capable of adjusting oscillation frequency according to an embodiment of the present invention.

FIG. 2 is a circuit diagram illustrating a ring-type differential injection-locked oscillator that may be used in an injection-locked frequency divider capable of adjusting oscillation frequency according to an embodiment of the present invention, and FIG. 3 is a circuit diagram illustrating a delay cell constituting part of a ring-type differential injection-locked oscillator.

Generally, the ring-type injection-locked oscillator may frequency-divide an injection signal by 1/N according to the number N of delay stages, and the ring-type differential injection-locked oscillator may frequency-divide an injection signal by 1/2N.

In FIG. 2, in the ring-type differential injection-locked oscillator 21, two differential delay cells 211 are cross-connected to each other, and are injection-locked to the sub-harmonic frequency of the injection signal V_INJ, thereby finally outputting the divided output signals V_OUTP and V_OUTN obtained by frequency-dividing the injection signal V_INJ by 1/2N of the frequency of the injection signal V_INJ, i.e., 1/4.

The differential delay cells 211 of the two-stage ring-type differential injection-locked oscillator 21 determine the magnitudes of the variable load resistors in response to the resistance adjustment signal CON_R, and thus the own oscillation frequency of the two-stage ring-type differential injection-locked oscillator 21 is determined.

Meanwhile, in the differential delay cell 211 of FIG. 2 illustrated in FIG. 3, and an injection signal V_INJ is applied to the gate of a node transistor M_INJ connected between the drains of two differential transistors M2 and M3 of a common differential amplifier.

Variable load resistors RL are connected in parallel to load transistors M4 and M5, and thus the delay time of the differential delay cell 211 may be adjusted.

As to the variable load resistors RL, a plurality of load resistors R, 2R and 4R, whose resistance values have been set according to a binary weighted method, is connected in parallel to the load transistors M4 and M5, and is connected to or disconnected from the load transistors M4 and M5 by switches SW1, SW2 and SW3 that are switched based on the bits CON_R<O>, CON_R<1> and CON_R<2> of the resistance adjustment signal CON_R, thereby varying the magnitude of total load resistance.

Referring back to FIG. 1, the reference clock divider 12 may generate a count-enable signal CNT_EN from a reference clock signal REF_CLK according to a reference division ratio signal REF_DIV.

More specifically, the reference clock divider 12 may generate the count-enable signal CNT_EN by frequency-dividing the reference clock signal REF_CLK according to the reference division ratio signal REF_DIV. For example, assuming that a 100 MHz reference clock signal REF_CLK is provided by a crystal oscillator, a 1 MHz clock signal obtained by frequency-dividing the reference clock signal REF_CLK by a reference division ratio of 1/100 becomes a pulse having an enabled section of 500 ns. The reference clock divider 12 may generate the count-enable signal CNT_EN based on the pulse.

The counter 13 may generate divided output count signals CNT_OUT based on the divided output signals V_OUTP and V_OUTN in response to the count-enable signal CNT_EN.

If the oscillation frequency of the two-stage differential ring-type sub-harmonic injection-locked oscillator 11 is adjusted in accordance with 8 GHz when a 32 GHz injection signal V_INJ is injected into the two-stage differential ring-type sub-harmonic injection-locked oscillator 11, the frequency of the injection signal V_INJ may be considered to be divided into 1/4 by the sub-harmonic injection-locked oscillator 11. Since the 8 GHz divided output signals V_OUTP and V_OUTN obtained by the division have the frequency that is too high to be directly input to the counter 13, they are frequency-divided by an addition division ratio of 1/5 by the additional divider 15, and thus 1.6 GHz additionally frequency-divided signals DIV may be applied to the counter 13. If the enabled section of the count-enable signal CNT_EN has a length of 500 ns, the counter 13 may count 800 pulses during the enabled section. Furthermore, accordingly, the counter 13 may be implemented as a 10-bit counter.

When the enabled section of the count-enable signal CNT_EN is terminated, the counter 13 terminates a count operation, and outputs divided output count signals CNT_OUT counted up to this time point.

The variable load resistor control unit 14 may compare target count signals CNT_TG, determined based on the target frequencies of the divided output signals V_OUTP and V_OUTN, with the divided output count signals CNT_OUT, and may output a resistance adjustment signal CON_R.

More specifically, the variable load resistor control unit 14 may include: a comparison unit 141 configured to compare the target count signals CNT_TG, determined based on the target frequencies of the divided output signals V_OUTP and V_OUTN, with the divided output count signals CNT_OUT, and to output one of an up signal UP and a down signal DN; and a resistance adjustment signal determination unit 142 configured to output an updated resistance adjustment signal CON_R obtained by increasing or decreasing the binary value of the resistance adjustment signal CON_R in response to the up signal UP or down signal DN.

In particular, the resistance adjustment signal determination unit 142 may update the bit values of the resistance adjustment signal CON_R according to a binary search technique whenever an up signal UP or down signal DN is input. In this case, the bit values of the resistance adjustment signal CON_R may be updated, for example, in such a manner that the bit values on respective digits may be determined by changing every two bits from an MSB based on an initial value in which only the MSB is 1 and the remaining bits are 0. All the bit values of the resistance adjustment signal CON_R correspond to a maximum of M times when the resistance adjustment signal CON_R has M bits.

In an embodiment, the resistance adjustment signal determination unit 142 may update the bit values of the resistance adjustment signal CON_R according to a sequential search technique whenever an up signal UP or down signal DN is input. In this case, the bit values of the resistance adjustment signal CON_R may be updated, for example, in such a manner that the bit values on respective digits are determined by changing every 1 bit from an LSB based on an initial value in which all bits are 0. All the bit values of the resistance adjustment signal CON_R correspond to a maximum of $2^M$ times when the resistance adjustment signal CON_R has M bits.

Meanwhile, the resistance adjustment signal determination unit 142 may output an adjustment completion signal LOCK to the outside when all the bit values of the resistance adjustment signal CON_R have been determined.

Whenever the variable load resistor control unit 14 receives the divided output count signals CNT_OUT from the counter 13, the variable load resistor control unit 14 needs to compare the target count signals CNT_TG with the divided output count signals CNT_OUT, and to update the resistance adjustment signal CON_R after the completion of the comparison. In order to accurately determine such operation timing, after the enabled section of the count-enable signal CNT_EN has been terminated, the reference clock divider 12 may generate a first clock signal CLK1 and provide the first clock signal CLK1 to the comparison unit 141, and may generate a second clock signal CLK2 obtained by delaying the first clock signal CLK1 and provide the second clock signal CLK2 to the resistance adjustment signal determination unit 142.

Since the target count storage unit 16 previously stores target count values determined based on the target frequencies of the divided output signals VOUTP and VOUTN, the target count storage unit 16 may set a target count value corresponding to the reference division ratio of the reference division ratio signal REF_DIV, and may output a target count signal CNT_TG corresponding to the set target count value.

For example, when the target frequency is 8 GHz, the addition division ratio is 1/5, the reference clock signal REF_CLK is 100 MHz and the reference division ratio is 1/100, the target count signal CNT_TG is to perform output at a target count value of 800.

If the variable load resistor control unit 14 receives the divided output count signal CNT_OUT having a count value of 700 from the counter 13, the comparison unit 141 is to output an up signal UP, and the resistance adjustment signal determination unit 142 is to update the bit values of the resistance adjustment signal CON_R toward a reduction in the magnitude of the variable load resistors RL.

Figure 4:
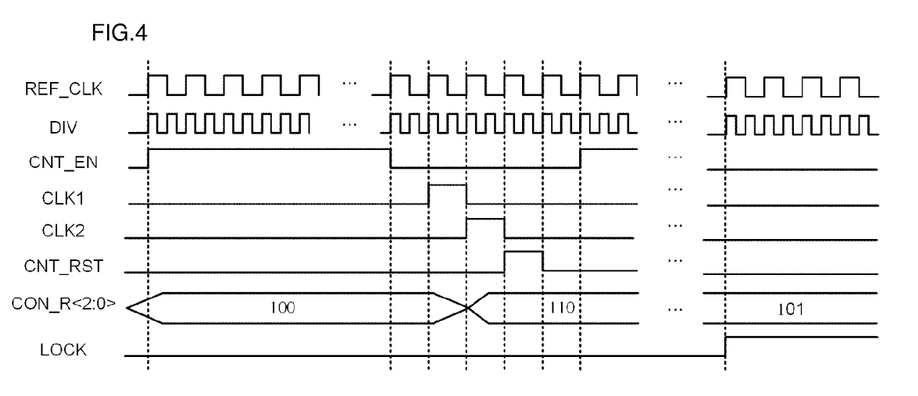
FIG. 4 is a timing diagram of control signals illustrating the operation of an injection-locked frequency divider capable of adjusting oscillation frequency according to an embodiment of the present invention.
Figure 5:
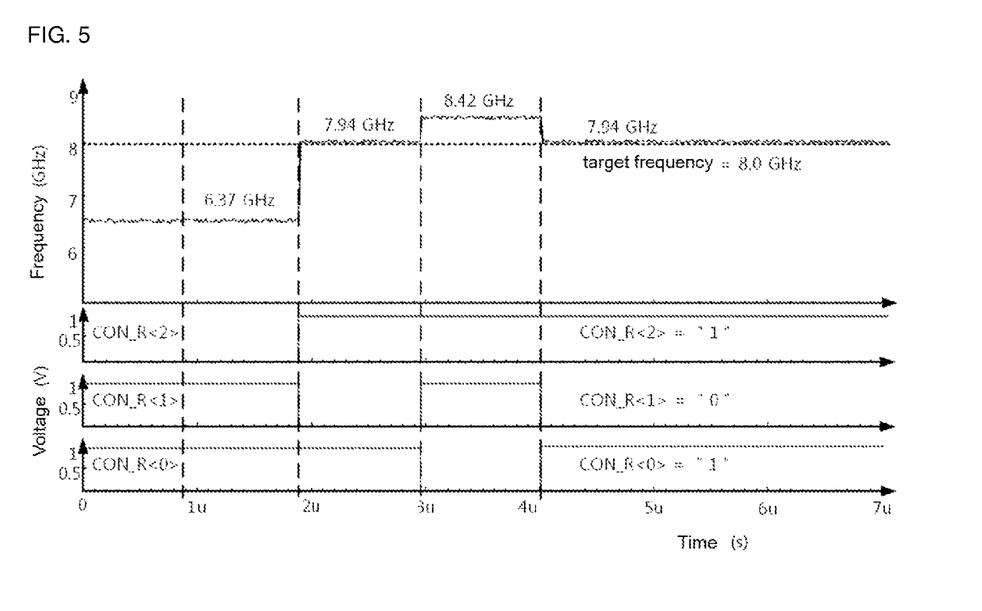
FIG. 5 is a waveform chart illustrating the adjustment of an oscillation signal in an injection-locked frequency divider capable of adjusting oscillation frequency according to an embodiment of the present invention.

Referring to FIGS. 4 and 5 in order to more specifically describe the operation, FIG. 4 is a timing diagram of control signals illustrating the operation of an injection-locked frequency divider capable of adjusting oscillation frequency according to an embodiment of the present invention, and FIG. 5 is a waveform chart illustrating the process of adjusting an oscillation signal.

From FIG. 4, it may be seen that a count-enable signal CNT_EN having a relatively long enabled section is generated by frequency-dividing the reference clock signal REF_CLK by the reference division ratio.

During the enabled section of the count-enable signal CNT_EN, the counter 13 counts the pulses of the additionally divided signals DIV.

After the enabled section of the count-enable signal CNT_EN has been terminated, the operation of the comparison unit 141 is enabled at a rising edge of the first clock CLK1. When the comparison unit 141 outputs an up signal UP or down signal DN according to the results of the comparison, the resistance adjustment signal CON_R is updated from 011 to 101 at a rising edge of the second clock CLK2.

After the second clock CLK2 has been enabled, the counter reset signal CNT_RST that resets the counter 13 may be enabled.

In this example, the first clock CLK1 may be viewed as a signal obtained by delaying the count-enable signal CNT_EN by one or two periods of the reference clock signal REF_CLK, and the second clock CLK2 may be a signal obtained by additionally delaying the first clock CLK1 by one or two periods of the reference clock signal REF_CLK. In the same manner, the counter reset signal CNT_RST may be viewed as a signal obtained by additionally delaying the second clock CLK2 by one or two periods of the reference clock signal REF_CLK.

This operation is repeated until the resistance adjustment signal CON_R cannot be updated any longer. Once all the bit values of the resistance adjustment signal CON_R have been determined, the adjustment completion signal LOCK is enabled.

In FIG. 5, in the state in which the initial set value of the resistance adjustment signal CON_R has been set to "011" according to the binary search technique, the oscillation frequency of the sub-harmonic injection-locked oscillator 11 is 6.37 GHz. Since the target frequency is 8 GHz, the divided output counter signal CNT_OUT is to have a counter value smaller than that of the target counter signal CNT_TG, the comparator 141 is to output an up signal UP, and the resistance adjustment signal determination unit 142 updates the set value of the immediately previous resistance adjustment signal CON_R from "011" to "101." In response to the first update, the MSB of the resistance adjustment signal CON_R is finally determined to be "1."

In response to the update of the resistance adjustment signal CON_R, the oscillation frequency of the sub-harmonic injection-locked oscillator 11 is changed to 7.94 GHz. Since the oscillation frequency is close to 8 GHz, i.e., the target frequency, but is slightly smaller than that, the divided output counter signal CNT_OUT is to have a counter value slightly smaller than that of the target counter signal CNT_TG, the comparator 141 is to re-output an up signal UP, and the resistance adjustment signal determination unit 142 updates the set value of the resistance adjustment signal CON_R from "101" to "110."

In response to the re-update of the resistance adjustment signal CON_R, the oscillation frequency of the sub-harmonic injection-locked oscillator 11 has been changed to 8.42 GHz. Since the oscillation frequency has exceeded 8 GHz, i.e., the target frequency, the divided output counter signal CNT_OUT is to have a counter value larger than that of the target counter signal CNT_TG, the comparator 141 is to output a down signal DN, and the resistance adjustment signal determination unit 142 updates the set value of the resistance adjustment signal CON_R from "110" to "101."

In response to the re-update of the resistance adjustment signal CON_R, the oscillation frequency of the sub-harmonic injection-locked oscillator 11 is returned to 7.94 GHz. Since the oscillation frequency slightly falls short of 8 GHz, i.e., the target frequency, the target frequency is determined to fall between the oscillation frequency when the resistance adjustment signal CON_R is set to "110" and the oscillation frequency when the resistance adjustment signal CON_R is set to "101" and the difference between "110" and "101" is a binary number of 1, the oscillation frequency therebetween may not be generated any longer by only updating the resistance adjustment signal CON_R. Accordingly, the resistance adjustment signal CON_R is locked to the set value "101," and the adjustment is determined.

Since an injection locking phenomenon occurs when the oscillation frequency becomes close to an injection frequency as described above, sub-harmonic injection locked oscillation occurs when the oscillation frequency is not accurately adjusted to the sub-harmonic of the injection frequency, and accordingly desired division performance may be obtained.

Figure 6:
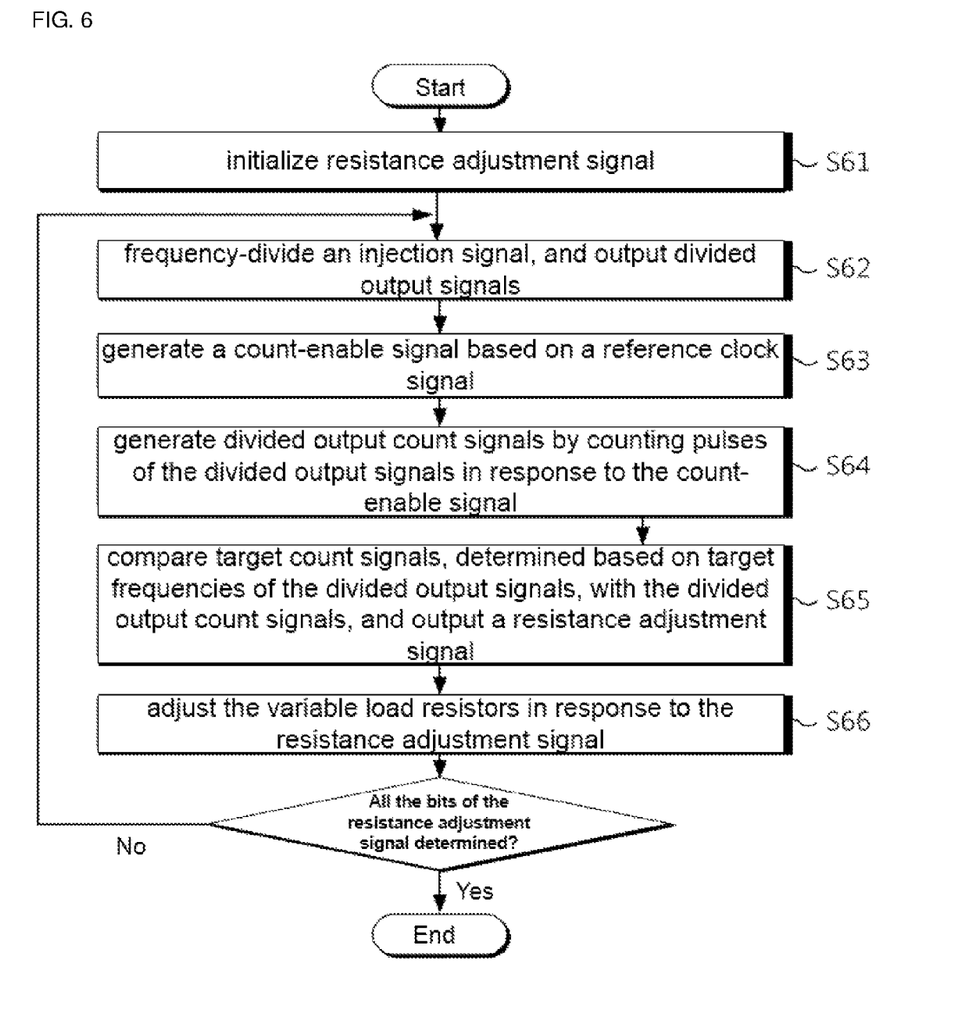
FIG. 6 is a flowchart illustrating a method of adjusting the oscillation frequency of an injection-locked frequency divider capable of adjusting oscillation frequency according to an embodiment of the present invention.

FIG. 6 is a flowchart illustrating a method of adjusting the oscillation frequency of an injection-locked frequency divider according to an embodiment of the present invention.

Referring to FIG. 6, the method of adjusting the oscillation frequency of the injection-locked frequency divider may start with step S61 of initializing a resistance adjustment signal CON_R adapted to adjust the magnitudes of variable load resistors RL that determine the oscillation frequency of the sub-harmonic injection-locked oscillator 11 provided in the injection-locked frequency divider 10.

In this case, the variable load resistors RL may be configured to vary the total load resistance in such a manner that a plurality of load resistors, whose resistance values have been set according to a binary weighted method, is connected in parallel and is connected or disconnected based on respective bits of the resistance adjustment signal.

In an embodiment, the sub-harmonic injection-locked oscillator 11 may be a ring-type oscillator, more specifically a ring-type differential oscillator.

Thereafter, at step S62, the sub-harmonic injection-locked oscillator 11 may frequency-divide an injection signal, and may output divided output signals.

At step S63, the injection-locked frequency divider 10 may generate a count-enable signal based on a reference clock signal.

In an embodiment, step S63 may include the step of generating the count-enable signal by frequency-dividing the reference clock signal according to a reference division ratio signal.

At step S64, the injection-locked frequency divider 10 may generate divided output count signals by counting the pulses of the divided output signals in response to the count-enable signal.

At step S65, the injection-locked frequency divider 10 may compare the target count signals, determined according to the target frequencies of the divided output signals, with the divided output count signals, and may output a resistance adjustment signal.

In an embodiment, step S65 may further include the step of outputting, by the injection-locked frequency divider 10, a target count signal, corresponding to a target count value selected from target count values determined based on the target frequencies of the divided output signals, according to the reference division ratio signal.

In an embodiment, step S65 may include: the step of comparing, by the injection-locked frequency divider 10, target count signals, determined based on the target frequencies of the divided output signals, with the divided output count signals, and outputting, by the injection-locked frequency divider 10, one of an up signal and a down signal; and the step of outputting, by the injection-locked frequency divider 10, an updated resistance adjustment signal obtained by increasing or decreasing the binary value of an immediately previous resistance adjustment signal in response to the up or down signal.

Meanwhile, the step of outputting the resistance adjustment signal may include the step of updating the bit value of the resistance adjustment signal according a sequential or binary search technique whenever the up or down signal is input and outputting an adjustment completion signal to the outside when all the bit values of the resistance adjustment signal have been determined.

At step S66, the sub-harmonic injection-locked oscillator 11 may adjust the variable load resistors in response to the resistance adjustment signal.

Steps S62 to S66 may be repeated until a condition in which an adjustment completion signal LOCK is generated is satisfied. For example, in a binary search method, steps S62 to S66 may be repeated M times when the resistance adjustment signal CON_R has M bits.

An injection-locked frequency divider capable of adjusting oscillation frequency according to at least one embodiment of the present invention has the advantages of both a small area and low power consumption.

An injection-locked frequency divider capable of adjusting oscillation frequency according to at least one embodiment of the present invention has the advantage of providing very fast adjustment speed and being able to adjust oscillation frequency with high reliability.

The above embodiments and the accompanying drawings are intended merely to clearly illustrate part of the technical spirit of the present invention, and it will be apparent to those skilled in the art that modifications and specific embodiments that those skilled in the art can easily derive from the present specification and the accompanying drawings are all included in the range of the rights of the present invention.

Furthermore, the apparatus according to the present invention may be implemented in a computer-readable storage medium in the form of computer-readable code. The computer-readable storage medium includes all types of storage devices in which data that can be read by a computer system is stored. Examples of the storage medium includes read only memory (ROM), random access memory (RAM), an optical disk, magnetic tape, a floppy disk, a hard disk, nonvolatile memory, etc. Furthermore, the computer-read-

What is claimed is:

1. An injection-locked frequency divider, comprising:
   a sub-harmonic injection-locked oscillator configured to have variable load resistors that are adjusted in response to a resistance adjustment signal, and to, when oscillation frequency determined based on magnitudes of the variable load resistors is a sub-harmonic of an injection signal, output signals having the oscillation frequency as divided output signals of the injection signal;
   a reference clock divider configured to generate a count-enable signal from a reference clock signal according to a reference division ratio;
   a counter configured to generate divided output count signals based on the divided output signals in response to the count-enable signal; and
   a variable load resistor control unit configured to compare target count values, determined based on target frequencies of the divided output signals, with the divided output count signals, and to output the resistance adjustment signal.

2. The injection-locked frequency divider of claim 1, wherein the reference clock divider is operative to generate the count-enable signal by frequency-dividing the reference clock signal according to the reference division ratio.

3. The injection-locked frequency divider of claim 2, wherein the variable load resistor control unit comprises:
   a comparison unit configured to compare the target count values, determined based on the target frequencies of the divided output signals, with values of the divided output count signals, and to output one of an up signal and a down signal; and
   a resistance adjustment signal determination unit configured to output an updated resistance adjustment signal obtained by increasing or decreasing a binary value of an immediately previous resistance adjustment signal in response to the up or down signal.

4. The injection-locked frequency divider of claim 3, wherein the reference clock divider generates a first clock signal after an enabled section of the count-enable signal has been terminated and provides the first clock signal to the comparison unit, and generates a second clock signal obtained by delaying the first clock signal and provides the second clock signal to the resistance adjustment signal determination unit.

5. The injection-locked frequency divider of claim 3, wherein the resistance adjustment signal determination unit is operative to update a bit value of the resistance adjustment signal according to a sequential search technique whenever the up or down signal is input, and to output an adjustment completion signal to an outside when all bit values of the resistance adjustment signal have been determined.

6. The injection-locked frequency divider of claim 3, wherein the resistance adjustment signal determination unit is operative to update a bit value of the resistance adjustment signal according to a binary search technique whenever the up or down signal is input, and to output an adjustment completion signal to an outside when all bit values of the resistance adjustment signal have been determined.

7. The injection-locked frequency divider of claim 1, wherein the variable load resistors are configured to vary total load resistance in such a way that a plurality of load resistors, whose resistance values have been set according to a binary weighted method, is connected in parallel and is then connected or disconnected based on respective bits of the resistance adjustment signal.

8. The injection-locked frequency divider of claim 1, further comprising a target count storage unit configured to previously store the target count values determined based on target frequencies of the divided output signals, and to output the target count signal to the variable load resistor control unit in accordance with a target count value selected in accordance with the reference division ratio.

9. The injection-locked frequency divider of claim 1, wherein the sub-harmonic injection-locked oscillator is a ring-type oscillator.

10. A method of adjusting oscillation frequency of an injection-locked frequency divider including a sub-harmonic injection-locked oscillator configured to output signals having an oscillation frequency as divided output signals of an injection signal when the oscillation frequency is a sub-harmonic of the injection signal, the method comprising:
    initializing, by the injection-locked frequency divider, a resistance adjustment signal adapted to adjust magnitudes of variable load resistors that determine oscillation frequency generated by the sub-harmonic injection-locked oscillator;
    frequency-dividing, by the sub-harmonic injection-locked oscillator, the injection signal, and outputting, by the sub-harmonic injection-locked oscillator, divided output signals;
    generating, by the injection-locked frequency divider, a count-enable signal from a reference clock signal according to a reference division ratio;
    generating, by the injection-locked frequency divider, divided output count signals by counting pulses of the divided output signals in response to the count-enable signal;
    comparing, by the injection-locked frequency divider, target count signals, determined based on target frequencies of the divided output signals, with the divided output count signals, and outputting, by the injection-locked frequency divider, the resistance adjustment signal; and
    adjusting, by the sub-harmonic injection-locked oscillator, the variable load resistors in response to the resistance adjustment signal.

11. The method of claim 10, wherein generating the count-enable signal comprises generating the count-enable signal by frequency-dividing the reference clock signal according to the reference division ratio.

12. The method of claim 11, wherein outputting the resistance adjustment signal comprises:
    comparing the target count values, determined based on the target frequencies of the divided output signals, with values of the divided output count signals, and then outputting one of an up signal and a down signal; and
    outputting an updated resistance adjustment signal obtained by increasing or decreasing a binary value of an immediately previous resistance adjustment signal in response to the up or down signal.

13. The method of claim 12, wherein outputting the resistance adjustment signal comprises updating a bit value of the resistance adjustment signal according to a sequential search technique whenever the up or down signal is input, and outputting an adjustment completion signal to an outside when all bit values of the resistance adjustment signal have been determined.

14. The method of claim 12, wherein outputting the resistance adjustment signal comprises updating a bit value of the resistance adjustment signal according to a binary search technique whenever the up or down signal is input, and outputting an adjustment completion signal to an outside when all bit values of the resistance adjustment signal have been determined.

15. The method of claim 10, wherein the variable load resistors are configured to vary total load resistance in such a way that a plurality of load resistors, whose resistance values have been set according to a binary weighted method, is connected in parallel and is then connected or disconnected based on respective bits of the resistance adjustment signal.

16. The method of claim 10, further comprising outputting the target count signal, corresponding to a target count value selected from the target count values determined based on target frequencies of the divided output signals, according to the reference division ratio.

17. The method of claim 10, wherein the sub-harmonic injection-locked oscillator is a ring-type oscillator.

* * * * *